(12) United States Patent
Micko

(10) Patent No.: US 7,622,845 B2
(45) Date of Patent: Nov. 24, 2009

(54) PIEZOELECTRIC TRANSDUCER SIGNAL PROCESSING CIRCUIT

(75) Inventor: Eric Scott Micko, Hong Kong (CN)

(73) Assignee: Suren Systems, Ltd., Hong Kong (HK)

( * ) Notice: Subject to any disclaimer, the term of this patent is extended or adjusted under 35 U.S.C. 154(b) by 116 days.

(21) Appl. No.: 11/567,899

(22) Filed: Dec. 7, 2006

(65) Prior Publication Data

US 2007/0109064 A1 May 17, 2007

Related U.S. Application Data

(63) Continuation-in-part of application No. 11/298,541, filed on Dec. 9, 2005, now Pat. No. 7,352,107, and a continuation-in-part of application No. 10/918,080, filed on Aug. 13, 2004, now Pat. No. 7,141,910, and a continuation-in-part of application No. 10/812,603, filed on Mar. 30, 2004, now Pat. No. 7,042,134.

(60) Provisional application No. 60/459,516, filed on Mar. 31, 2003.

(51) Int. Cl.
*H01L 41/08* (2006.01)
(52) U.S. Cl. .................... 310/316.01; 310/317; 310/319
(58) Field of Classification Search ............ 310/316.01, 310/317, 319; 327/103
See application file for complete search history.

(56) References Cited

U.S. PATENT DOCUMENTS

| | | | |
|---|---|---|---|
| 4,405,906 A | 9/1983 | Luscher | |
| 4,661,785 A | 4/1987 | Benjaminson | |
| 4,916,339 A | 4/1990 | Lloyd | |
| 6,011,415 A | 1/2000 | Hahn et al. | |
| 6,028,491 A | 2/2000 | Stanchak et al. | |
| 6,111,342 A | 8/2000 | Muramatsu et al. | |
| 6,169,459 B1 | 1/2001 | Wessendorf | |
| 6,340,816 B1 | 1/2002 | Micko | |
| 6,448,689 B2 | 9/2002 | Satoh | |
| 6,456,511 B1 | 9/2002 | Wong | |
| 6,647,764 B1 | 11/2003 | Paul et al. | |
| 6,741,137 B1 | 5/2004 | Sibrai et al. | |
| 6,836,190 B2 | 12/2004 | Kato | |
| 6,848,299 B2 | 2/2005 | Paul et al. | |
| 7,042,134 B2 * | 5/2006 | Micko ................ | 310/316.01 |
| 7,352,107 B2 * | 4/2008 | Micko ................ | 310/316.01 |

(Continued)

OTHER PUBLICATIONS

PerkinElmer Optoelectronics, "Elementorientation and Connections LHI 2068" Drawing No. 2/71197; May 14, 2001.

(Continued)

*Primary Examiner*—Mark Budd
(74) *Attorney, Agent, or Firm*—Stephen C. Beuerle; Procopio Cory Hargreaves & Savitch LLP

(57) ABSTRACT

A piezoelectric detector circuit has at least one input line, a piezoelectric transducer in the input line, an amplifier receiving signals on the input line and generating an output, and one or two feedback elements through which the output is sent back to the input line. The circuit may be a discrete time sampled operational amplifier (DTOA) based transconductance or "voltage output mode" circuit. In one embodiment, protection elements are associated with amplifier input lines to establish a reference voltage.

22 Claims, 13 Drawing Sheets

U.S. PATENT DOCUMENTS

| | | |
|---|---|---|
| 2004/0164647 A1 | 8/2004 | Micko |
| 2004/0189149 A1 | 9/2004 | Micko |
| 2004/0228475 A1 | 11/2004 | Scott et al. |
| 2005/0016283 A1 | 1/2005 | Micko |
| 2006/0152109 A1* | 7/2006 | Micko ........................ 310/319 |
| 2007/0109064 A1* | 5/2007 | Micko ........................ 331/158 |

OTHER PUBLICATIONS

International Search Report and Written Opinion issued in PCT/US06/61782 on Mar. 31, 2008.

* cited by examiner

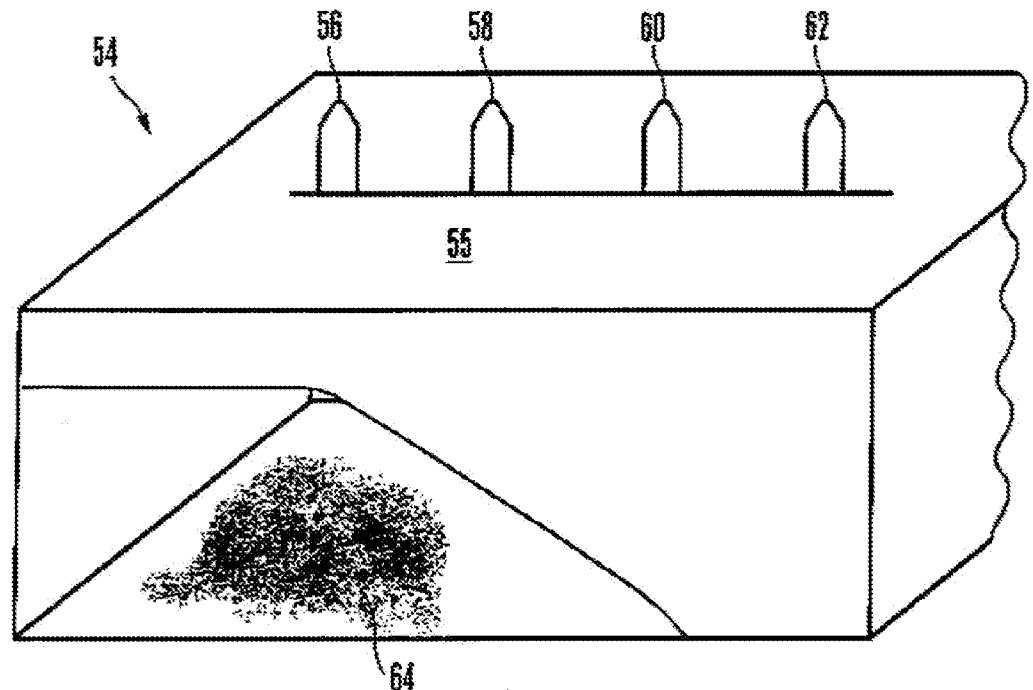
Figure 11
Figure 12
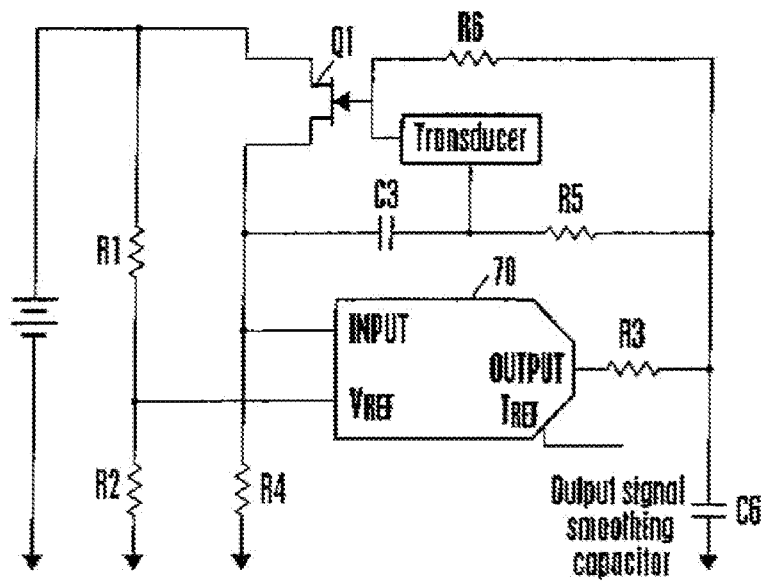

PIEZOELECTRIC TRANSDUCER SIGNAL PROCESSING CIRCUIT

RELATED APPLICATIONS

This is a continuation-in-part of and claims priority from pending U.S. patent application Ser. No. 11/298,541, filed Dec. 9, 2005, which is a CIP of pending U.S. patent application Ser. No. 10/918,080, filed Aug. 13, 2004, which is a CIP of U.S. patent application Ser. No. 10/812,603, filed Mar. 30, 2004, now U.S. Pat. No. 7,042,134, claiming priority in turn from U.S. provisional application Ser. No. 60/459,516, filed Mar. 31, 2003, all of which are incorporated herein by reference.

FIELD OF THE INVENTION

The present invention relates generally to piezoelectric transducer systems.

BACKGROUND OF THE INVENTION

Piezoelectric sensor systems are used in a wide variety of applications. As but one non-limiting example, some security systems detect movement in a monitored space using passive infrared (PIR) motion sensors, which detect changes in far infrared radiation (8-14 micron wavelength) due to temperature differences between an object (e.g. a human) and its background environment. Upon detection, motion sensors generally transmit an indication to a host system, which may in turn activate an intrusion "alarm", change room lighting, open a door, or perform some other function. Such sensors advantageously are simple and relatively inexpensive.

The detectors of a PIR sensor can include pyroelectric detectors that measure changes in far infrared radiation. Such detectors operate by the "piezoelectric effect", which causes electrical charge migration in the presence of mechanical strain. Pyroelectric detectors take the form of a capacitor—two electrically conductive plates separated by a dielectric. The dielectric can be a piezoelectric ceramic. When far infrared radiation causes a temperature change (and thus some mechanical strain) in the ceramic, electrical charge migrates from one plate to the other. If no external circuit (or a very high impedance circuit) is connected to the detector ("voltage output mode"), then a voltage that can be measured appears as the "capacitor" charges. If an external circuit of relatively low impedance is connected between the plates ("current output mode"), then a current flows.

A piezoelectric detector in the current output mode is placed in a transconductance amplifier circuit, in which, in lieu of allowing the voltage between the plates of the transducer to change substantially, charge is conducted through a feedback resistor of a high impedance operational amplifier to create a voltage that establishes the output signal of the circuit. By "high" impedance is meant an impedance of at least $10^7$ Ohms.

As understood herein, heretofore conventional transconductance circuits for piezoelectric detectors have required relatively expensive high impedance operational amplifiers as a result of having to measure small amounts of charge produced by piezoelectric detectors. Therefore, what is needed is a system and method that overcomes these significant problems found in the conventional systems as described above.

SUMMARY OF THE INVENTION

Several versions of a piezoelectric transducer signal processing circuit for, e.g., a piezoelectric far infrared radiation detector, that may be implemented in an infrared motion sensor are disclosed. Both transconductance and voltage output mode circuits are described.

In one embodiment, a piezoelectric detector includes a piezoelectric transducer and a transconductance circuit electrically connected to the transducer. The transconductance circuit includes a field effect transistor (FET) and a transconductance resistor connected to the gate of the FET. The circuit also includes a discrete time sampled operational amplifier-based constant multiplying circuit.

The transconductance circuit can define a common ground and a signal voltage reference that is not directly connected to the common ground. A feedback circuit signal may be derived from the source of the FET. In some implementations the FET source signal can be connected to the input voltage line of the discrete time sampled operational amplifier-based constant multiplying circuit, and more specifically may be connected to the input voltage line of an analog to digital converter of the discrete time sampled operational amplifier circuit.

In another aspect, a piezoelectric detector package includes a housing and a piezoelectric transducer in the housing. A discrete time sampled operational amplifier circuit is operably engaged with the piezoelectric transducer. In non-limiting embodiments the piezoelectric transducer can be connected to the input line of the discrete time sampled operational amplifier circuit.

In yet another aspect, a discrete time sampled operational amplifier (DTSOA)-based transconductance circuit includes a reference voltage, an input line, a piezoelectric transducer connected from the reference voltage to the input line, and an amplifier receiving signals on the input line and generating an output based on the transducer signal. A feedback element through which the output is sent back to the input line is also provided. The feedback element may be, e.g., a resistor or a charge-switching circuit.

In non-limiting implementations the transconductance circuit includes a comparator connected to the input line and sending signals to a digital logic processing circuit, which in turn generates a digital output. The output represents the transducer signal. If desired, the digital logic circuit can be established by a microcontroller.

In another aspect, a discrete time sampled operational amplifier (DTSOA) circuit includes an input line and an FET- or operational amplifier-based transconductance circuit in the input line. A DTSOA-based differentiator (or "delta-modulator") circuit receives signals on the input line and generates an output. If desired, a feedback element can be provided through which the output is sent back to the input line.

In another embodiment, a piezoelectric detector transconductance circuit includes (−) and (+) protection voltage lines (generally power supply lines), a first input line, a first pair of protection diodes connected to the power supply lines and establishing a first reference voltage at the first input line, an amplifier receiving the first reference voltage on the first input line, a piezoelectric transducer connected from a second reference voltage to a second input line, an amplifier receiving signals on the second input line and generating an output based on the transducer signal, a feedback element through which the output is sent back to the second input line, and a second pair of protection diodes connected from the second input line to the protection voltage lines. The second reference voltage may be the same as the first reference voltage. A separate buffer amplifier may be interposed between the first pair of protection diodes and the first input line.

In another embodiment, a discrete time sampled operational amplifier (DTSOA)-based transconductance circuit includes a reference voltage, an input line, a piezoelectric transducer connected from the reference voltage to the input line, and an amplifier receiving signals on the input line and generating one or two outputs based on the transducer signal. Feedback elements through which the outputs are sent back to the input line are also provided. The feedback elements may be, e.g., resistors, capacitors or charge-switching circuits. One feedback element circuit may be designed to pass only AC signals, whereas another may be designed to pass both AC and DC components.

In some embodiments, the amplifier includes a comparator connected to the input line, both generating a first output and sending signals to a further included digital logic processing circuit, which in turn generates a second output. Both outputs represent the transducer signal. If desired, the digital logic circuit can be established by a microcontroller.

In other non-limiting implementations, the amplifier further includes an FET having its gate connected to the input line, and sending a signal to a comparator, which both generates a first output and sends signals to a further included digital logic processing circuit, which in turn generates a second output. Both outputs represent the transducer signal. If desired, the digital logic circuit can be established by a microcontroller.

In yet other non-limiting implementations, the amplifier includes an FET having its gate connected to the input line, and sending a signal to a comparator which generates a first output, and further includes a positive feedback path to create hysteresis that induces the circuit to oscillate, and thus to provide its own time reference.

In a final aspect, a discrete time sampled operational amplifier (DTSOA)-based differentiator circuit includes an input line, a "voltage output mode" piezoelectric transducer circuit connected to the input line, and a DTSOA-based differentiator ("delta-modulator") circuit receiving signals on the input line and generating an output. Feedback elements through which the output is sent back to the input line are also provided. The feedback elements may be, e.g., resistors, capacitors or charge-switching circuits. One feedback element circuit may be designed to pass only AC signals, whereas another may be designed to pass both AC and DC components. A further positive feedback path is provided to create hysteresis that induces the circuit to oscillate, and thus to provide its own time reference.

Other features and advantages of the present invention will become more readily apparent to those of ordinary skill in the art after reviewing the following detailed description and accompanying drawings.

BRIEF DESCRIPTION OF THE DRAWINGS

The details of the present invention, both as to its structure and operation, can best be understood in reference to the accompanying drawings, in which like reference numerals refer to like parts, and in which:

FIG. 11 is a perspective view of a transducer package;

FIG. 12 is a schematic diagram of a modified version of the fourth embodiment shown in FIG. 9, using a discrete time sampled operational amplifier in lieu of an analog operational amplifier;

DETAILED DESCRIPTION

Certain embodiments as disclosed herein provide for piezoelectric transducer signal processing circuits. For example, one circuit described herein has an input line and a piezoelectric transducer in the input line, an amplifier receiving signals on the input line and generating an output based on the transducer signal, and at least one feedback element through which the output is sent back to the input line.

After reading this description it will become apparent to one skilled in the art how to implement the invention in various alternative embodiments and alternative applications. However, although various embodiments of the present invention will be described herein, it is understood that these embodiments are presented by way of example only, and not limitation. As such, this detailed description of various alternative embodiments should not be construed to limit the scope or breadth of the present invention as set forth in the appended claims.

Figure 1:
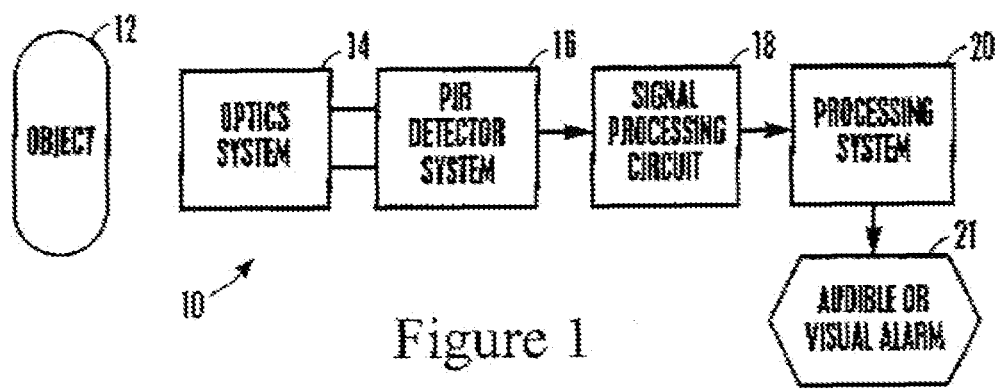
FIG. 1 is a block diagram of a motion sensing system architecture using a piezoelectric transducer detector system.

Referring initially to FIG. 1, an exemplary non-limiting embodiment of a detection system is shown, generally designated 10, for detecting a moving object 12, such as a human. The system 10 includes an optics system 14 that can include appropriate mirrors, lenses, and other components known in the art for focussing images of the object 12 onto a passive infrared (PIR) detector system 16. In response to the moving object 12, the PIR detector system 16 generates a signal that can be filtered, amplified, and digitized by a signal processing circuit 18, with a processing system 20 (such as, e.g., a computer or application specific integrated circuit) receiving the signal and determining whether to activate an audible or visual alarm 21 or other output device such as an activation system for a door, etc.

Having described one application of the piezoelectric detector, attention is now directed to FIGS. 2 to 22, which show various embodiments of a signal processing circuit incorporating a piezoelectric detector. The piezoelectric detector is incorporated in a transconductance circuit in the embodiments of FIGS. 2 to 18 and 20, and in a voltage output mode circuit in the embodiments of FIGS. 19, 21 and 22. In accordance with present principles, a "transconductance circuit" is one in which, in lieu of allowing the voltage between the plates of a transducer, such as the transducer 22 of FIG. 2, to change substantially, charge is conducted through a resistor to create a voltage that establishes the output signal of the circuit. A "voltage output mode" circuit is one in which the transducer is operated in voltage mode, in which (at AC signal frequencies) the detector's internally migrating charge is not conducted outside, instead being allowed to cause the voltage between the plates of the transducer to change, thus establishing the output voltage of the circuit.

Figure 2:
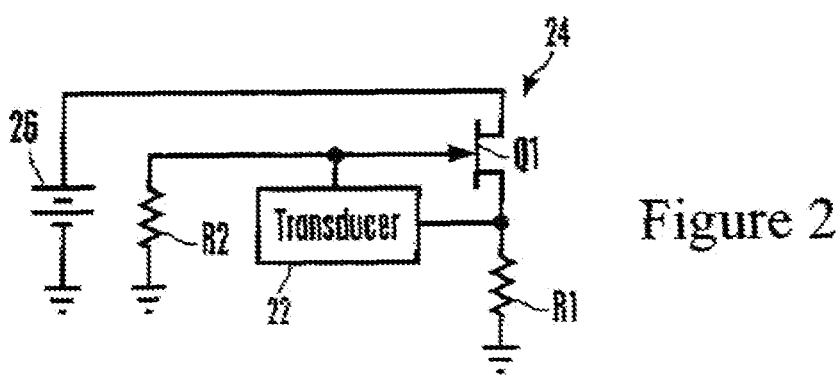
FIG. 2 is a schematic diagram of a first embodiment of a piezoelectric transducer transconductance circuit.

As shown in FIG. 2, a piezoelectric transducer 22 is provided in a transconductance circuit 24 of a first embodiment. The transconductance circuit 24 has a direct current (DC) voltage supply 26. The circuit 24 can be thought of as a monitoring circuit for the piezoelectric transducer 22. Also, the circuit 24 impedance-buffers and amplifies the signal from the transducer 22.

The piezoelectric transducer 22 can be any piezoelectric transducer. In one exemplary illustration, the piezoelectric transducer 22 is a pyroelectric detector that measures changes in far infrared radiation by the "piezoelectric effect", which causes electrical charge migration in the presence of mechanical strain that can be induced by, e.g., far infrared radiation-induced temperature change. The piezoelectric transducer 22 may take the form of a capacitor, i.e., two electrically conductive plates separated by a dielectric which can be a piezoelectric ceramic. When the ceramic of the piezoelectric transducer 22 experiences mechanical strain, electrical charge migrates from one plate to the other plate.

In the circuit 24 shown in FIG. 2, the transducer 22 is connected between the source and the gate of a junction field effect transistor (FET) Q1 that may be implemented by a type 2N4338 FET in a non-limiting embodiment. The power supply 26, which can be a five volt power supply established by one or more dry cell batteries, is connected to the drain of the FET Q1 as shown.

As shown in FIG. 2, the source current of the FET Q1 is changed to a voltage by passing it through an output resistor R1. The voltage is connected via a transconductance resistor R2 and causes a current to flow back to the gate of the FET Q1, with both resistors R1, R2 being connected to ground but with the transducer 22 "floating" (i.e., with its signal reference voltage not connected to ground) between the source and gate of the FET Q1.

With the above structure, the FET Q1 controls the feedback current through the transconductance resistor R2 to the gate of the FET Q1 by varying the voltage across the output resistor R1, which, via the ground node, impresses the same changing voltage across the transconductance resistor R2. The alternating current (AC) component of the output of the circuit 24, which can be mathematically calculated in sufficient accuracy to reflect circuit function by multiplying the output current of the transducer 22 by the resistance of the transconductance resistor R2, is measured across the output resistor R1. The direct current (DC) component of the output is determined by the gate-source operating voltage of the FET Q1.

In other words, the signal voltage reference node of the circuit 24 floats with respect to the circuit common ground, in contrast to conventional non-transconductance circuits in which the signal voltage reference node is grounded and the FET is used as a buffer for a piezoelectric detector operated in a voltage output mode. Consequently, the present combination of transconductance circuit structure produces the characteristic larger signal voltage as compared to conventional voltage output mode circuits, while advantageously permitting the use of a relatively inexpensive FET Q1 of the same type as used in conventional voltage output mode circuits in lieu of a relatively more expensive high impedance operational amplifier. Viewed another way, the circuit 24 shown in FIG. 2 in essence has three functional blocks, namely, the transducer 22, the FET Q1, and the transconductance resistor R2, with the latter being a feedback element, in contrast to conventional voltage output mode circuits.

Figure 3:
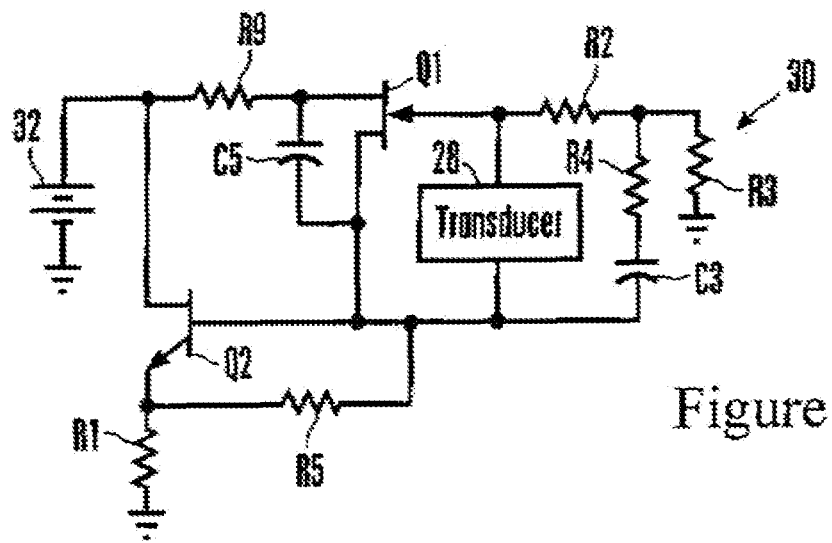
FIG. 3 is a schematic diagram of a second embodiment of a piezoelectric transducer transconductance circuit.
Figure 4:
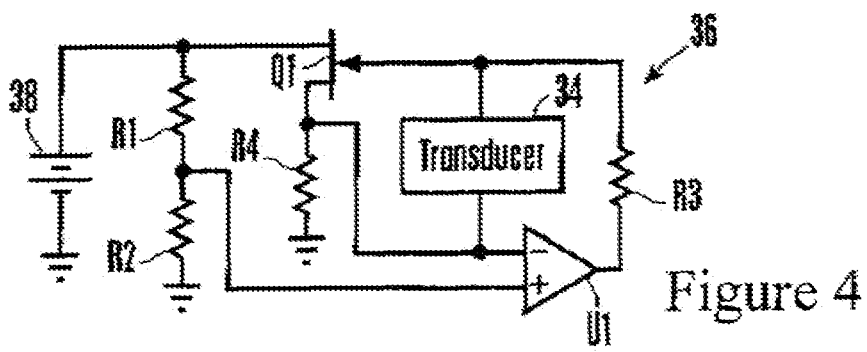
FIG. 4 is a schematic diagram of a third embodiment of a piezoelectric transducer transconductance circuit.
Figure 5:
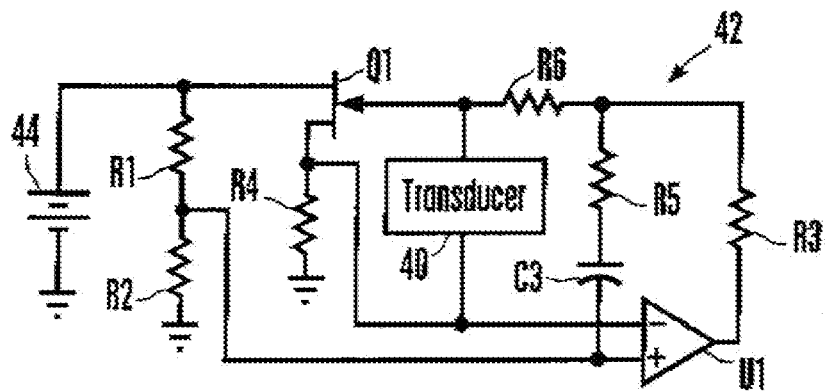
FIG. 5 is a schematic diagram of a fourth embodiment of a piezoelectric transducer transconductance circuit.

FIGS. 3-5 show various circuits that add components to those of FIG. 2 to increase even further the signal developed by the circuits. As shown in FIG. 3, a piezoelectric transducer 28 is provided in a transconductance circuit 30 having a DC voltage supply 32. In the circuit 30 shown in FIG. 3, the transducer 28 is connected between the source and the gate of a junction field effect transistor (FET) Q1 and, thus, the signal voltage reference of the circuit 30 floats with respect to the circuit common ground. The power supply 32 is connected to the drain of the FET Q1 as shown through a drain resistor $R_D$.

In the circuit shown in FIG. 3, not only is the FET Q1 provided, but a bipolar junction transistor (BJT) Q2 as well, in addition to further circuit elements discussed below. If desired, an inexpensive standard input impedance operational amplifier may be used instead of the BJT Q2. By "standard input impedance" is meant an impedance of no more than $10^7$ Ohms.

In the embodiment shown in FIG. 3, the base of the BJT Q2 is connected to the transducer 28 and to the source of the FET Q1 as shown, with the emitter of the BJT Q2 being connected to grounded output resistor R1 and with the collector of the BJT Q2 being connected to the power supply 32 and being separated from the drain of the FET Q1 by the drain resistor R9. Because of the extra gain provided by the BJT Q2 and because its base is connected to the source of the FET Q1, an output feedback voltage divider that is established by resistors R3, R4 and a capacitor C3 can be added so as to amplify the basic transconductance voltage developed across a transconductance resistor R2 by, for example, ten, with this voltage being fed back as a current to the gate of the FET Q1 through the transconductance resistor R2. Thus, the AC component of the output of the circuit 30 (as measured across the output resistor R1) in FIG. 3 may be ten times that of the circuit 24 shown in FIG. 2, given the same stimulus energy to the transducers of both circuits.

Additionally, in the circuit 30 shown in FIG. 3 the drain of the FET Q1 is essentially short-circuited (for AC signals) by a shorting capacitor C5 to the source of the FET Q1, which, as noted previously, is the signal voltage reference node. With the FET Q1 drain essentially short-circuited to the signal voltage reference node, the internal capacitance of the FET Q1 no longer establishes an undesirable feedback element, extending the high frequency response of the circuit 30.

Now referring to FIG. 4, a piezoelectric transducer 34 is provided in a transconductance circuit 36 having a DC voltage supply 38. In the circuit 36 shown in FIG. 4, the transducer 34 is connected between the source and the gate of a junction field effect transistor (FET) Q1 and, thus, the signal voltage reference of the circuit 36 floats with respect to the circuit common ground. The power supply 38 is connected to the drain of the FET Q1 as shown.

In the embodiment shown in FIG. 4, an inexpensive standard input impedance operational amplifier U1 has its inverting input connected to the transducer 34 and to the source of the FET Q1, which is indirectly connected to ground (i.e., through a resistor R4). The output of the operational amplifier U1 is fed back to the gate of the FET Q1 through a transconductance resistor R3. Also, the non-inverting input of the operational amplifier U1 is connected to a voltage divider consisting of a resistor R1, which in turn is connected to the power supply 38, and a resistor R2, which is connected to ground.

As was the case in the previously-described circuits, the voltage across the FET source resistor R2 that is developed from the source current is fed back as a current to the gate of the FET Q1. The feedback path extends through the operational amplifier U1 in the circuit 36 shown in FIG. 4 and through a transconductance resistor R3. The transconductance current summing node is at the gate of the FET Q1, which buffers the inverting input of the operational amplifier U1. The non-inverting input of the operational amplifier U1 is the "floating" signal voltage reference node for the circuit 36. The operational amplifier U1 varies its output voltage to control the feedback current through the transconductance resistor R3, with the output signal of the circuit being the AC component of the output voltage of the operational amplifier U1, the DC component being determined by the gate-source operating voltage of FET Q1.

The circuit 36 in FIG. 4 provides a substantially constant voltage (maintained by the operational amplifier U1 at its inverting input) for a signal voltage reference node. Accordingly, the FET Q1 drain-gate voltage is essentially constant compared to the amplifier output and feedback voltage fed back as a current through the transconductance resistor R3 to the gate of the FET Q1. Consequently, there is no high frequency limit due to any effect of the FET Q1 internal drain-gate capacitance, so a resistor-capacitor pair R9-C5 shown in the transistor-only circuit of FIG. 3 is not required in the circuit 36 of FIG. 4.

FIG. 5 shows a piezoelectric transducer 40 in a transconductance circuit 42 having a DC voltage supply 44 that in most respects is identical to the circuit 36 shown in FIG. 4, except that a resistor R5 and a capacitor C3 are provided between the non-inverting input of an operational amplifier U1 and a feedback resistor R3, a transconductance resistor R6 being provided between the tap of the resistor R5/capacitor C3 pair and the gate of the FET Q1. Because of the ample gain provided by the operational amplifier U1, the output voltage divider established by the resistors R3 and R5 and the capacitor C3 can amplify the basic transconductance voltage by, e.g., ten.

FIGS. 6-9 respectively correspond to FIGS. 2-5, with the respective circuits being substantially identical as shown except that in the variations shown in FIGS. 6-9, the AC and DC connections to the transducer are separated from each other, so as to avoid such high DC outputs that the circuit enters a condition known as "saturation" where the circuit DC output voltage should be (from an ideally calculated standpoint) more positive than the positive end of the power supply or more negative than the negative end of the power supply. Since this is not possible in reality, the circuit DC output can become "stuck" against either the positive or negative end of the power supply, in which case no AC signals are possible, otherwise rendering the circuit totally non-functional. Such high DC outputs could result from DC amplification due to the parallel leakage resistance present in some transducers. When functioning properly the circuits shown in FIGS. 6-9 operate just like their respective counterparts in FIGS. 2-5, because it is the AC signal that is used in the present invention, not the DC signal.

Figure 6:
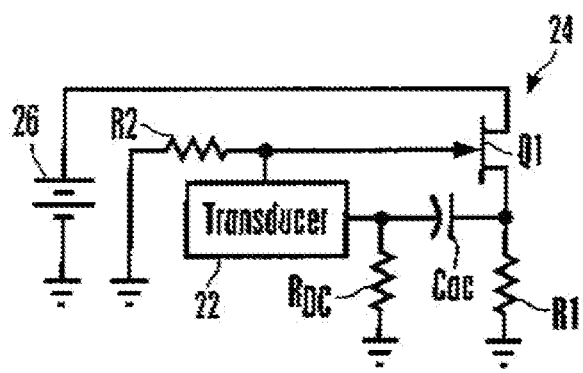
FIG. 6 is a schematic diagram of a modified version of the first embodiment shown in FIG. 2, wherein the alternating current (AC) and direct current (DC) connections to the transducer are separated from each other to avoid DC outputs that, if sufficiently high, might otherwise saturate the circuit.
Figure 7:
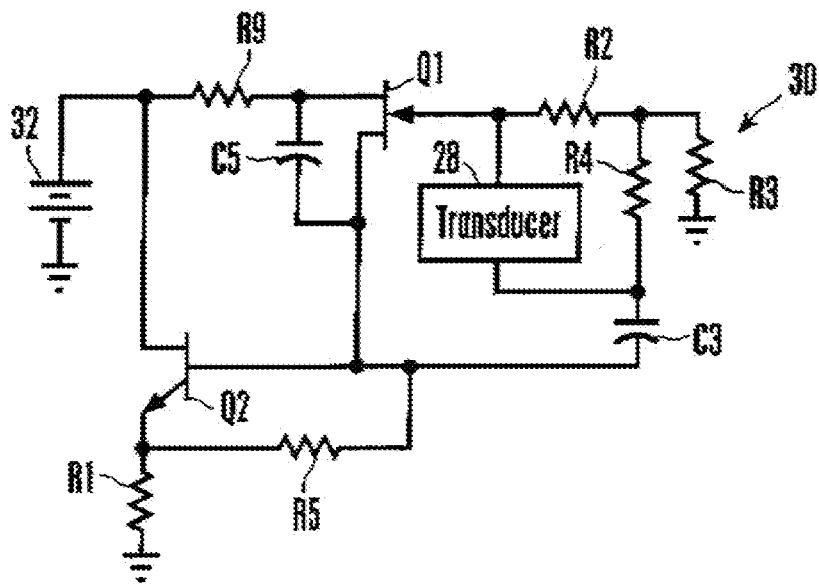
FIG. 7 is a schematic diagram of a modified version of the second embodiment shown in FIG. 3, wherein the AC and DC connections to the transducer are separated from each other.
Figure 8:
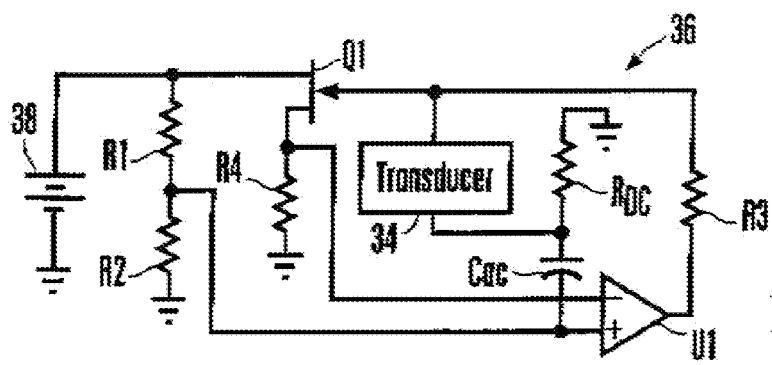
FIG. 8 is a schematic diagram of a modified version of the third embodiment shown in FIG. 4, wherein the AC and DC connections to the transducer are separated from each other.
Figure 9:
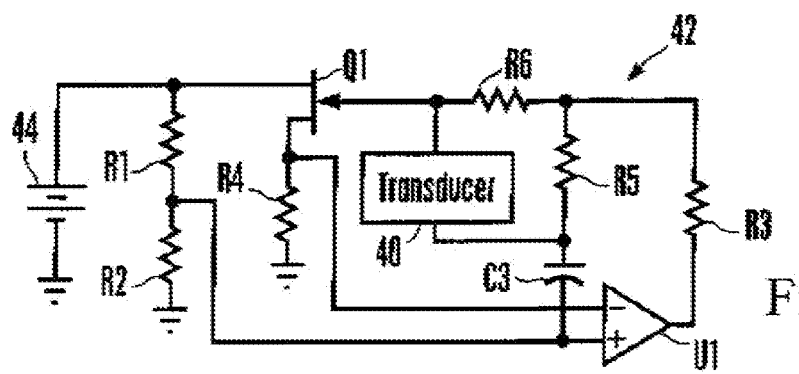
FIG. 9 is a schematic diagram of a modified version of the fourth embodiment shown in FIG. 5, wherein the AC and DC connections to the transducer are separated from each other.

The above separation of AC from DC is accomplished in FIGS. 6 and 8 by passing the AC component of the transducer output signal through an AC-passing DC-blocking capacitor $C_{AC}$ and thence to the signal processing circuitry, i.e., to the FET Q1 in FIG. 6 and to the operational amplifier U1 in FIG. 8, while shunting the DC component of the transducer output signal to ground through a DC grounding resistor $R_{DC}$. In FIGS. 7 and 9, on the other hand, recognizing that an AC-passing, DC-blocking capacitor C3 already exists in these circuits, the outputs of the respective transducers are connected to a line between the capacitor C3 and resistor (R4 in FIG. 7, R5 in FIG. 9) in these circuits.

Figure 10:
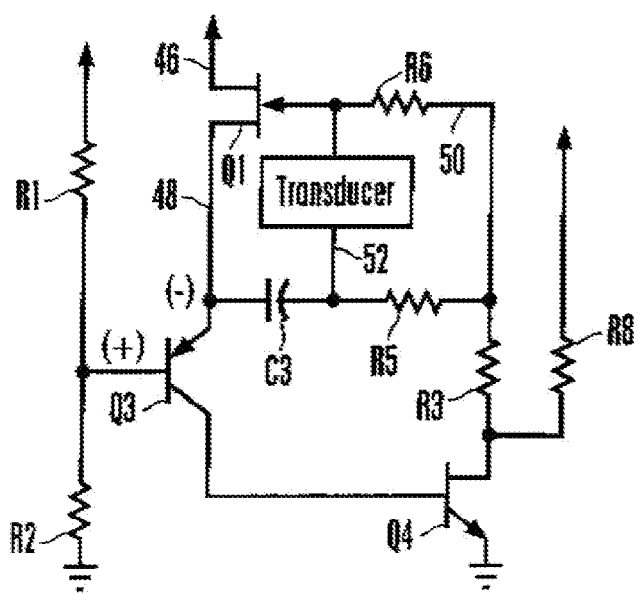
FIG. 10 is a schematic diagram of still another alternate embodiment of a piezoelectric transducer transconductance circuit.

FIG. 10 shows a circuit similar to that shown in FIG. 9, wherein like reference numerals refer to like parts, but wherein the operational amplifier U1 is replaced with a PNP transistor Q3 in cascade with an NPN transistor Q4 to achieve a less expensive implementation. More specifically, in FIG. 10 a transconductance resistor R6 is connected to the gate of the FET Q1, the drain of which is connected to a power supply line 46 and the source of which is connected, through an output line 48 having disposed in it a PNP transistor Q3, to a voltage divider circuit that includes the resistors R1 and R2, which provide a bias voltage signal for operation of the FET Q1 by establishing its source voltage. The PNP transistor Q3 buffers this bias signal to establish the FET Q1 source bias voltage. Also, as shown the transistor Q3 passes the FET drain-to-source output current to the base of the NPN transistor Q4, where, because of the gain of the transistor Q4, a proportionately larger transistor output current (collector-emitter current) is developed that is in turn converted back to a voltage by a load resistor that is connected to the power supply voltage.

A feedback signal from the source of the FET Q1 is provided as before to the transconductance resistor R6 through a feedback line 50, and as discussed above in the specific circuit shown in FIG. 10 it is provided through the PNP transistor Q3 and through the NPN transistor Q4 and feedback resistor R3. The piezoelectric transducer is connected via a transducer line 52 and a capacitor C3 (in a voltage divider portion of the circuit) which provides an AC connection to the signal voltage reference node, as shown in accordance with principles set forth above in relation to FIGS. 5 and 9.

All of the above circuits include a piezoelectric transducer and a transconductance resistor that are connected together to a gate of a FET, and the drain of the FET is connected to a power supply and the source is connected to a feedback portion of the circuit. FIG. 11 shows that the piezoelectric transducer, FET, and transconductance resistor may be provided in a single package for convenience, with four connectors such as but not limited to pins being provided on the package to connect the transducer, FET source, FET gate, and transconductance resistor to the circuit described above. Other connector structure, e.g., sockets, pads, wires that can be soldered, etc. can be used, as long as the connectors are accessible from outside the housing.

Accordingly, FIG. 11 shows a package structure, generally designated 54, which includes a hollow, parallelepiped-shaped housing 55 that includes four external connectors, 56, 58, 60, 62, such as but not limited to pins. The hollow housing 55 holds the present piezoelectric transducer, FET, and transconductance resistor in any of the circuits shown above. Accordingly, the first and second connectors 56 and 58 may be electrically connected to the FET within the housing 55. More specifically, the first connector 56 may be connected to the drain of the FET and, using the circuit shown in FIG. 10 for illustration, may be externally connected, by means of a complementarily-shaped connector, to the line 46 to thereby connect the FET drain to the power supply. On the other hand, the second FET connector 58 is connected to the source of the FET within the housing 55, and it may engage a complementarily-shaped connector that in turn is connected to the line 48 in FIG. 10 to thereby connect the FET source to the portion of the circuit shown.

The third connector 60 may be internally connected to the transconductance resistor. The third connector 60 may then be externally engaged with a complementarily-shaped connector to connect the line 50 in FIG. 10 to the transconductance resistor R6 within the housing 55. The fourth connector 62 may be connected to the piezoelectric transducer contained inside the package structure 54. The fourth connector 62 may then be connected to the line 52 which, as shown in the illustrative circuit of the FIG. 10, connects the piezoelectric transducer at the FET gate to other circuit structure. It is preferred that the three components of the hollow housing package structure 54, i.e., the piezoelectric transducer, FET, and transconductance resistor, be packaged in dry nitrogen 64. It is to be understood that the physical connector arrangement shown in FIG. 10 is exemplary only, and that other connector arrangements (e.g., one connector on each of four sides of the housing 55) may be implemented.

With the above four-connector, three component package, the exceedingly small currents that are associated with very high resistances, such as a typical transconductance resistor of 125 G Ohms, are all contained inside of the housing 55. The circuitry external to the transducer, FET, and transconductance resistor uses currents much higher than those that flow inside of the housing. Thus, while a single housing could be made to hold the entire circuit shown in, e.g., FIG. 10, such housings are quite expensive, whereas the simple four-pin package shown in FIG. 11, which can be made in just the right size to hold the aforementioned three parts, is inexpensive.

FIG. 12 shows a circuit that is in many respects identical to that shown in FIG. 9 (and that may, in accordance with principles discussed above, also be configured similar to FIG. 5 when ac-dc separation is not required) except that the analog operational amplifier U1 is replaced with a discrete time sampled operational amplifier (DTSOA) circuit 70 to save the cost of an analog operational amplifier, and a smoothing capacitor C6 has been added at the output of the DTSOA circuit 70 to smooth the digital output signal. Further cost savings may be realized by using an oscillating amplifier that performs similarly to the sampled amplifier.

In one general form, a discrete time sampled operational amplifier circuit may be constructed by summing input and feedback signals in analog form, with analog-to-digital converter and digital circuits providing high gain. However, it is to be understood that many embodiments of discrete time sampled operational amplifier circuits are contemplated herein, including the embodiment shown in FIG. 13.

Figure 13:
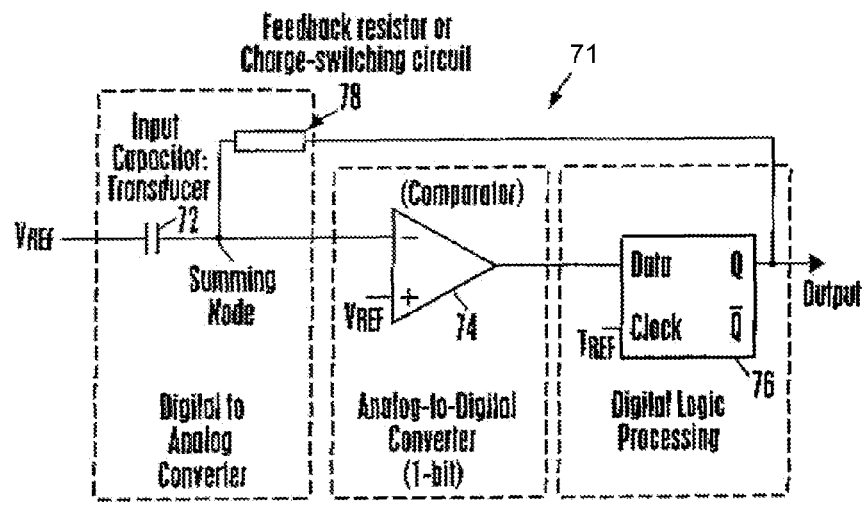
FIG. 13 is a schematic diagram of a non-limiting discrete time sampled operational amplifier-based transconductance circuit according to another embodiment.

Accordingly, turning now to the embodiment of FIG. 13, a schematic diagram is shown of a DTSOA feedback control circuit that uses the above-discussed piezoelectric transducer in a transconductance circuit 71. In alternative DTSOA applications, an input capacitor can be substituted for the transducer in the circuit 71 of FIG. 13 and an input voltage substituted for the reference voltage, thus to construct a DTSOA-based differentiator (or "delta-modulator"), or yet again an input resistor instead of a capacitor can be used, in conjunction with a capacitor connected from the comparator inverting input to the reference voltage or system ground, to achieve a DTSOA-based constant multiplication feedback control circuit of a type that may serve as the circuit 70 of FIG. 12.

In an embodiment where the circuit 71 of FIG. 13 is a transconductance circuit, the component 72 in FIG. 13 is a piezoelectric transducer and is illustrated functionally as a capacitor from the reference voltage line to a comparator 74. Transducer 72 is the input device of a transconductance circuit. It is to be understood that this is in contrast with the circuit in FIG. 12, wherein the transducer is connected in an analog transconductance circuit based on the FET Q1 and transconductance resistor R6, all of which is separate from the DTSOA-based constant multiplying circuit that serves the same function as an analog amplifier, as shown in FIG. 12. In the alternative embodiments discussed above, component 72 may be a capacitor or an input resistor, and the circuit 71 may then be used as the circuit 70 of FIG. 12.

In any case, returning to FIG. 13, the comparator 74 functions as an analog-to digital converter that outputs a digitized signal to processing logic 76. The output of the processing logic 76 may be fed back through a feedback resistor or charge-switching circuit 78 to the input line in which the piezoelectric transducer is disposed as shown, with the feedback resistor or charge-switching circuit 78, together with the transducer 72, establishing a digital to analog converter. Also, where the output of the processing logic 76 is fed back via a path additional to that inside the DTSOA, that output is sent through the smoothing capacitor C6 shown in FIG. 12.

With the above disclosure in mind, it may now be appreciated that digital signal low and high output states from the comparator 74, and the latched data output voltage of the processing circuit 76, may be zero and five volts, respectively, from a ground reference. The latch voltage logical input threshold of the processing circuit 76 may be two and a half volts. Reference voltages ($V_{ref}$) may be two and a half volts at both points, or separate reference voltages may be provided. The sampling reference time ($T_{ref}$) of the processing circuit 76 may be a period much shorter than the time constant created by the feedback resistor and transducer capacitance, so that those components may provide an average direct current voltage corresponding to the percentage of time that the latched voltage output from the processing circuit 76 spends in high versus low states. The circuit shown in FIG. 13 performs substantially identically to an analog transconductance circuit, with the exception that its output is digital, in the form of low or high voltages that are determined at each time-sampling. The time-average value of those digital voltages corresponds to the analog amplifier's steady-state output voltage.

In some applications, comparator and latch functions may be provided in a microcontroller, thus eliminating the relatively high cost of a separate analog comparator or amplifier. Also, as mentioned above the feedback may be provided via an active charge-switching circuit, to save the cost of the high-value resistor typically associated with piezoelectric transducers.

Figure 14:
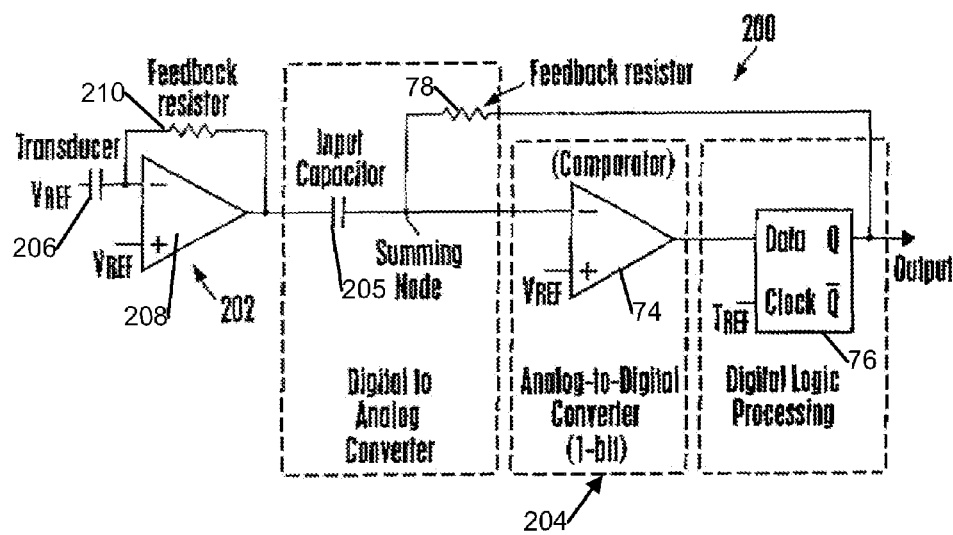
FIG. 14 is a schematic diagram a non-limiting discrete time-sampled differentiator circuit with a conventional transconductance circuit at its input, according to another embodiment.

FIG. 14 illustrates a modified transconductance circuit according to another embodiment. In some cases it may not be desirable or feasible to embed a transducer directly into a discrete-time-sampled operational amplifier-based transconductance circuit, as in FIG. 13, yet it is still desirable to realize the advantages of operating a transducer in a transconductance circuit, and of obtaining a digitally-encoded output as from a discrete-time-sampled operational amplifier-based differentiator circuit. In such cases, either an operational amplifier-based transconductance circuit, or one of several JFET-based (or JFET/op-amp-based) transconductance circuits (as shown in U.S. Pat. No. 7,042,134 and U.S. Patent Application Publication Number 20040189149) can provide the first function of a buffered transducer output with a "flat" frequency response, whence the buffered output can drive the input of a discrete-time-sampled operational amplifier-based differentiator circuit, which, in turn, can provide a digitally encoded output.

FIG. 14 shows a circuit 200 in which an operational amplifier-based transconductance circuit 202 drives the input of a discrete-time-sampled operational amplifier-based (DTSOA) differentiator circuit 204. Transconductance circuit 202 has a transducer 206 connected in an input line of amplifier 208, and a feedback resistor 210 through which the output is connected back to the input line. The output of circuit 202 is connected to the input of DTSOA differentiator circuit 204. Circuit 204 comprises a digital to analog converter (DAC), a comparator (analog to digital converter), and digital logic processing. Some parts of the circuit 204 are similar or identical to parts of the circuit 71 of FIG. 13, and like reference numerals have been used as appropriate. However, the DTSOA differentiator circuit 204, which is also widely called a "delta modulator", and which is commonly used to digitally encode analog signals, has an ordinary capacitor 205 where the transducer 72 is found in the DAC of FIG. 13. If desired, either or both circuits 202 and 204 in FIG. 14 may have a charge-switching feedback circuit (switched-capacitor) in lieu of the resistor.

Figure 15:
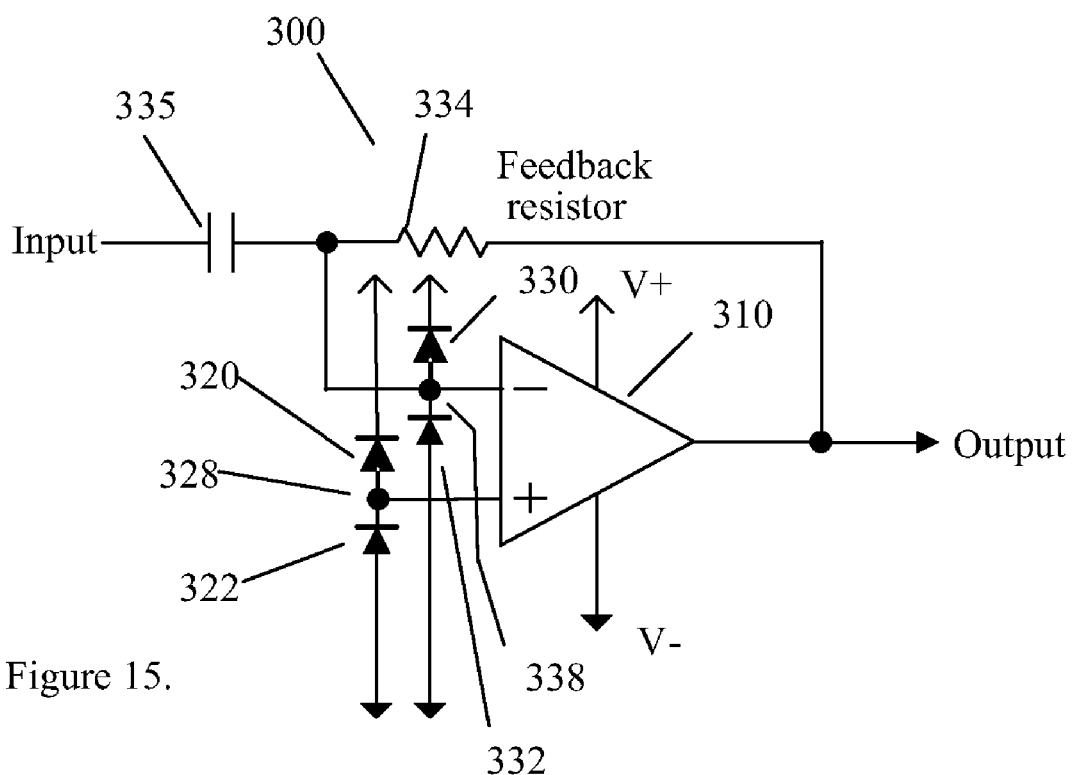
FIG. 15 is a schematic diagram of a transconductance circuit according to another embodiment having an amplifier input leakage current reduction circuit.

FIG. 15 illustrates an embodiment of a transconductance circuit 300 which has protection elements for reducing operational amplifier leakage current. As the transconductance circuits of FIGS. 13 and 14 may sometimes be realized with high-impedance amplifiers, it is useful to provide a method of reducing the input leakage current in such amplifiers.

Modern low-cost amplifiers tend to be CMOS types, wherein the amplifier inputs may have very low leakage, yet the input protection diodes provided for such amplifiers may exhibit higher leakage. Each amplifier input has two protection diodes, one connected from the amplifier input to the amplifier's positive supply voltage (V+) (sometimes also called $V_{DD}$), or to another voltage more positive than the normal circuit operating voltages, and one connected to the negative supply voltage (V−) (sometimes also called $V_{SS}$), or to another voltage more positive than normal circuit operating voltages. Both diodes are reverse-biased except if an external signal tries to drive the input more positive than V+ or more negative than V−. In the reverse-biased condition, the diodes act as very-high-value resistors.

In order to achieve very low leakage currents, it would be desirable to balance the currents of the two diodes, so that the net leakage current (flowing into or out of the protection diodes to or from the protected input) would be zero. However, this is very difficult. The two diodes on each input are not identical, so balancing their relatively large leakage currents (to equal a very low value) is not practical, especially for all input voltages. However, with a constant input voltage, as is present in many types of transconductance circuits, diode-balancing can be practical in a CMOS integrated circuit designed for this purpose.

FIG. 15 shows one embodiment of a diode-balancing transconductance circuit 300. The two inputs of amplifier 310 are protected by two diode pairs consisting of diodes 320 and 322, and of diodes 330 and 332, respectively, with each pair connected between positive and negative supply voltages V+ and V−. These diodes are reverse-biased in normal use, so that they function as resistors, and the two diode pairs therefore function as "voltage dividers" and establish voltages (between V+ and V−) at their mutual connection nodes 328 and 338. If either of these nodes is connected to any other node at the same voltage, then, of course, no current flows between the two nodes. In this embodiment, a protection diode-established voltage is taken as a reference, and transferred to a principal-function circuit input (in this example, a transducer's transconductance amplifier summing node, which is operated at a constant voltage), such that the input operates at a voltage exactly (or very nearly) equal to the voltage established by its own protection diodes, thus causing the minimum amount of current to flow into or out of its protection diodes into the principal-function circuit. This technique is applicable to piezoelectric transducer applications since the transconductance amplifier operating point or voltage need not be any particular value, and thus may be set by the input protection diodes.

Figure 16:
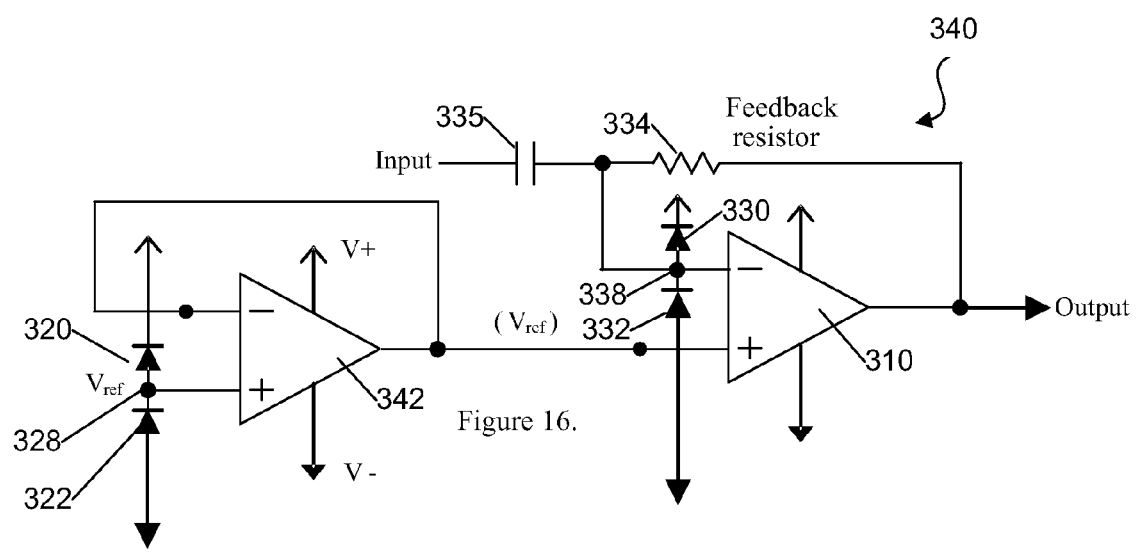
FIG. 16 is a schematic diagram of a transconductance circuit according to another embodiment with an alternative amplifier input leakage current reduction circuit.

In circuit 300, the (+) input of operational amplifier 310 is set at the voltage established by a reference pair of protection diodes 320 and 322. Because the amplifier 310 impresses a voltage at its (−) input that is equal to that at its (+) input, the amplifier's (−) input is at that same voltage. Since, on the same integrated circuit substrate, all of the protection diodes are similar, the (−) input protection diodes 330 and 332 independently establish a voltage similar to that established by the reference pair of protection diodes 320 and 322. Therefore, the voltage impressed by the amplifier 310 at its (−) input is exactly (or very nearly) equal to the voltage established by protection diodes 330 and 332, and the leakage current flowing from protection diodes 330 and 332 into the functional circuit (in this case, a very high-value transconductance feedback resistor 334) is close to zero. In practice, of course, small currents flow, due to diode mismatch, and also due to real amplifier leakage current. However, these are very small—much smaller than in situations where voltages are not controlled according to this embodiment. Furthermore, the amplifier leakage current may be canceled to some extent by interposing a buffer amplifier identical to amplifier 310 between the mutual connection node 328 of the reference pair of protection diodes 320 and 322, and the (+) input of amplifier 310, as illustrated in FIG. 16 and described in more detail below. In any case, it is fortunate that, in piezoelectric transducer applications where a transducer 335 is connected in the input line, the transconductance amplifier operating voltage, as established at its (+) input, need not always be any particular value, and thus may be set by input protection diodes, which do not form very accurate voltage dividers, except in terms of matching among themselves on the same integrated circuit substrate.

As noted above, FIG. 16 illustrates another embodiment of a transconductance circuit 340 with a buffer amplifier 342 that can provide a reference voltage for required circuit functions, e.g. as a reference input for capacitor (or transducer) 335. Some components of the circuit 340 of FIG. 16 are identical to that of FIG. 15, and like reference numerals have been used as appropriate, but in this embodiment buffer amplifier 342 is placed at the positive input of the transducer's transconductance amplifier 310, between node 328 and the positive input of amplifier 310. The first pair of protection diodes 320, 322 in this case is connected to the positive input of the buffer amplifier 342, and a feedback line is connected between the output of amplifier 342 and the negative input of the amplifier. The output of buffer amplifier 342 is connected to the positive input of transconductance amplifier 310. The second pair of protection diodes 330, 332 is connected to the negative input of transconductance amplifier. Each pair of voltage divider diodes, specifically the pair 320,322 and the pair 330,332, establishes a voltage at its mutual connection node 328 and 338, respectively. This node is at a voltage $V_{ref}$ between V+ and V−. If this node is connected to another node at the same voltage, then no current flows between the two nodes.

The amplifier 342 impresses a voltage at its negative input which is equal to that at its positive input. The amplifier's positive input is set at the voltage established by the reference pair 320, 322 of protection diodes. The negative input protection diodes 330, 332 on the principal-function or transconductance amplifier 310 independently establish a voltage similar to that established by the reference pair of protection diodes. Therefore, the leakage current flowing into the functional circuit (in this case, a very high-value transconductance feedback resistor 334) is at or close to zero if the input diodes are perfectly or close to perfectly matched, assuming zero amplifier input bias current. In practice, of course, small currents flow, due to diode mismatch and due to real amplifier leakage current. However, these currents are quite small, and normally smaller than in situations not using protection diodes as illustrated in FIGS. 15 and 16. In the embodiments of FIGS. 15 and 16, a protection diode-established voltage is taken as a reference and transferred to a principal function circuit, or in this case to a transducer's transconductance amplifier 310.

As has been illustrated in FIGS. 12 and 13, a DTSOA can be included in the feedback control loop of a transconductance circuit. In such feedback loops, it is sometimes desirable to separate AC and DC (negative) feedback signals. This separation is useful because piezoelectric transducer signals are often only AC signals, and thus may be treated differently from the DC offsets of typical circuits. In FIG. 5, the resistor-capacitor combination R3/R5/C3 is one example of AC and DC signal separation. In the embodiment of FIG. 5, the DC feedback to R6 is essentially unity (because R6 is much greater than R3). However, at AC frequencies (greater than the cutoff frequency established by C3 and the aggregate circuit resistances), the AC feedback is lower than the DC feedback, being divided by the voltage divider consisting of R3 and R5. In this case, then, due to the control loop, by selecting R3 and R5, the AC gain at the amplifier output (i.e. the gain for the transducer signal) can be made much higher than the DC gain. Such separate control of AC and DC circuit gain, by means of a resistor/capacitor network, can be added to the circuits of FIGS. 12 and 13. Separate gain control, in turn, allows the use of low-cost, simple DTSOA-based transconductance and delta-modulator circuits having high AC gain, yet low DC gain (as may be appropriate for providing large transducer signal gain) while also accomplishing necessary management of the delta-modulator circuit's DC parameters. FIGS. 17 to 21 illustrate several embodiments of circuits for accomplishing AC/DC separation in discrete time sampled operational amplifier (DTSOA) transducer circuits. For clarification, it should be noted that this newly-mentioned type of AC-DC feedback separation is different than, and may co-exist with, the AC-DC separation circuits that are introduced in FIGS. 6, 7, 8 and 9. Furthermore, in order to clarify the following discussion, it should be noted that "DC feedback" shall be used herein to describe (negative) feedback signals containing both AC and DC frequency components, whereas "AC feedback" shall be used to describe such signals containing only AC frequency components.

Figure 17:
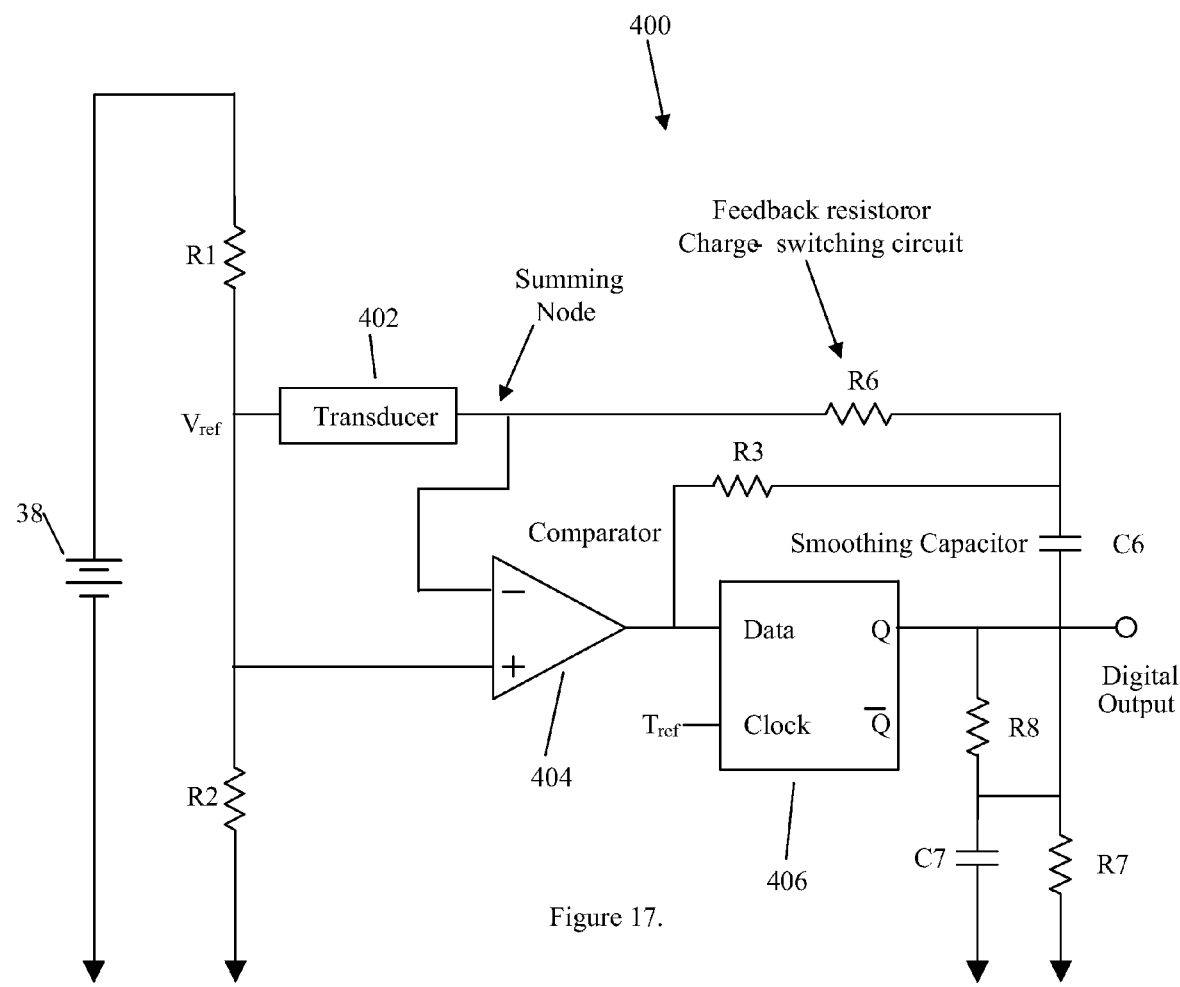
FIG. 17 is a schematic diagram of a piezoelectric transducer circuit with separate AC/DC feedback paths according to another embodiment.

FIG. 17 illustrates an embodiment of a DTSOA transducer transconductance circuit 400 which has separate AC/DC feedback paths and an external time reference $T_{ref}$ at the clock input of logic processing circuit 406. Circuit 400 is similar to that of FIG. 13, except that the output of comparator 404 provides a separate DC feedback signal through resistor R3 and C6 for DC circuit offset control. This DC feedback is adjusted by resistor R3 and smoothed by capacitor C6 on its way to feedback resistor R6. The non-inverting input of comparator 404 is connected to a voltage divider comprising a resistor R1, which is connected to the power supply 38, and a resistor R2 which is connected to ground.

The output of logic processing circuit 406 provides a separate AC feedback signal for the DTSOA transconductance circuit, which, in addition to the logic processing circuit 406, includes transducer 402 as input capacitor, comparator 404, and feedback resistor R6. The transconductance circuit's (AC) gain can be set by means of feedback voltage divider R8/R7, which provides a much smaller feedback rectangular wave than a DTSOA circuit's usual full-supply-voltage "high" and "low" wave (e.g. from +5 V to GND). As with the analog control loop circuits, this reduced feedback allows higher closed-loop gain. This smaller feedback rectangular wave is fed through C6 (as an AC coupling capacitor) to the feedback resistor R6. The logic processing circuit's digital output contains only the high-gain delta-modulated (AC) transducer signal.

Figure 18:
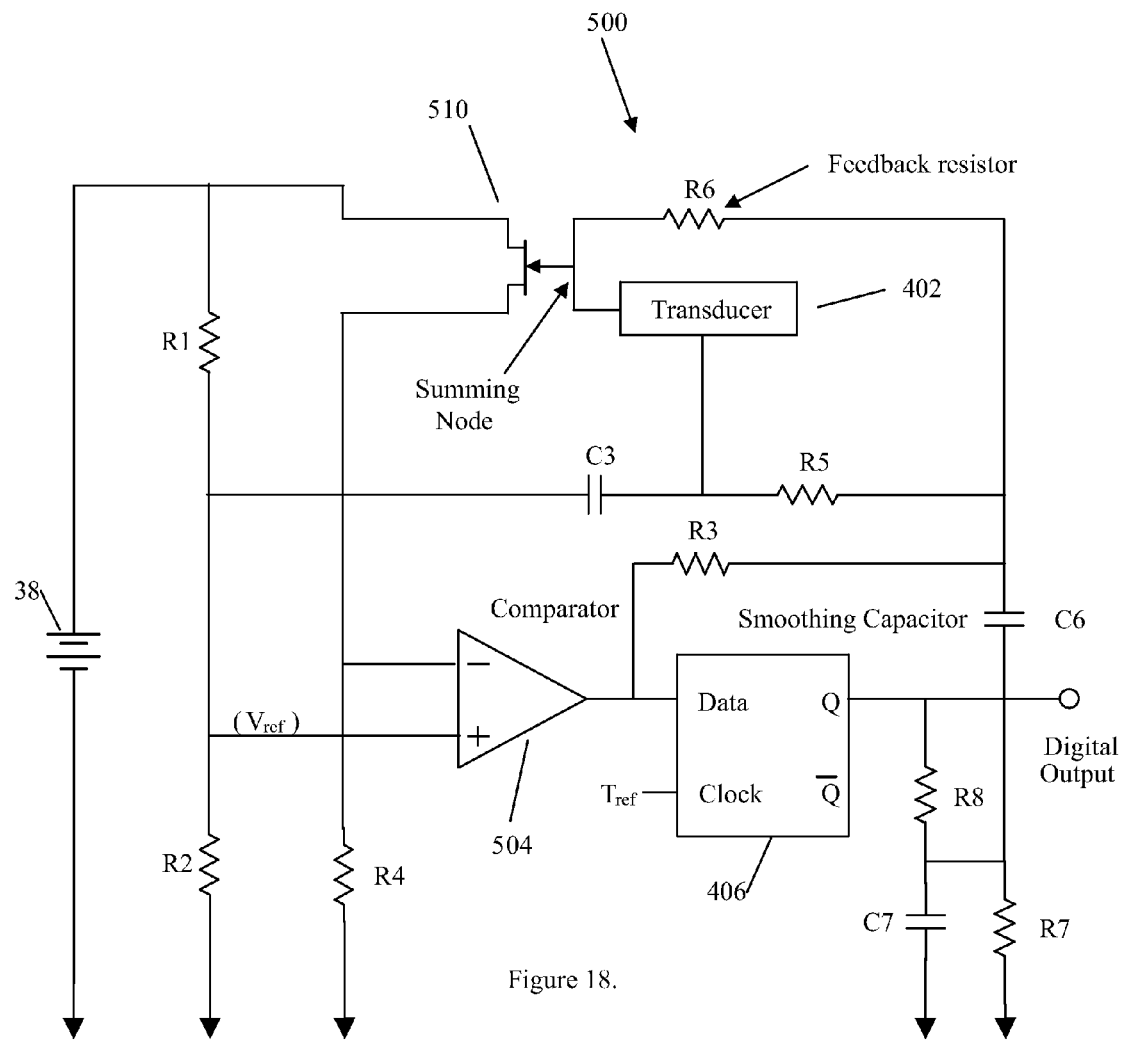
FIG. 18 is a schematic diagram of a modified version of the embodiment shown in FIG. 17.

FIG. 18 shows a circuit 500 that is similar to circuit 400, and like reference numbers have been used for like components as appropriate. However, in circuit 500, the DTSOA circuit employs a low-cost, low-impedance comparator 504 with an FET 510 providing a high impedance summing node input for the piezoelectric transducer transconductance circuit. As in the circuit of FIG. 17, separate AC and DC feedback signals are provided. In FIG. 18, the DTSOA from the embodiment of FIG. 12 is opened up and expanded to include the FET 510, with the output of comparator 504 used to create a separate DC output signal, with the DC offset controlled by means of feedback resistor R3 as in the previous embodiment. The entire circuit operates as a delta modulator. The "D" latch digital output contains only the delta-modulated (AC) transducer signal, and thus is quiescent at a 50% duty cycle.

Figure 19:
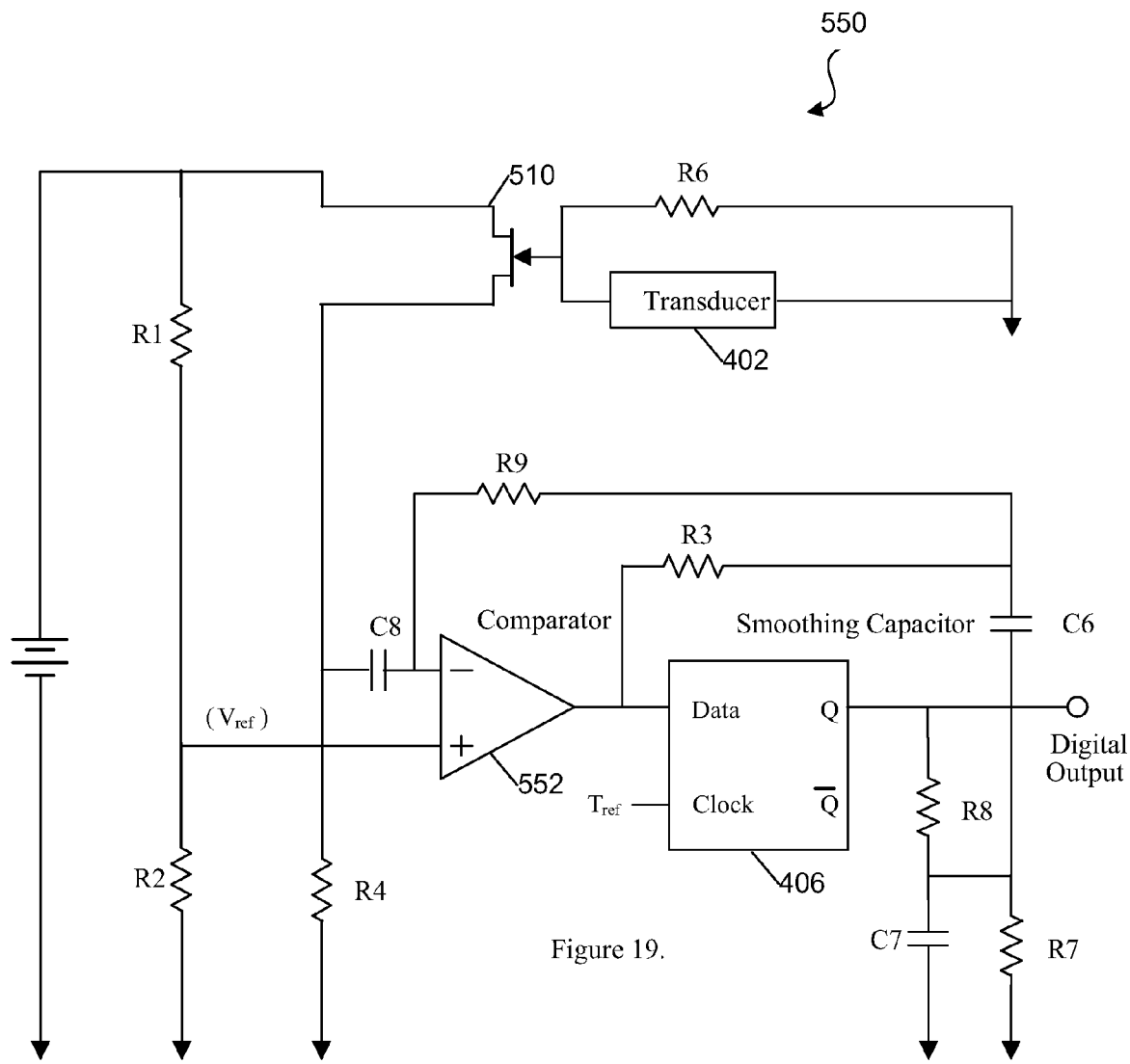
FIG. 19 is a schematic diagram of a modified version of the embodiment of FIG. 18 in which a voltage-mode circuit is substituted for the transconductance circuit.

FIG. 19 illustrates a circuit 550 similar to the circuit 500 of FIG. 18, except that a voltage-mode transducer circuit is substituted for the transconductance circuit. As in FIG. 18, the DTSOA of FIG. 12 is opened up and the output of comparator 552 is used to create a separate DC output signal for DC offset control by means of feedback resistor R3. Circuit 550 provides AC/DC feedback separation in operation with a voltage output mode piezoelectric transducer which has an FET 510 as an output voltage buffer device. Circuit 550 retains most aspects of circuit 500, except for the operation of transducer 402 in a voltage output mode, the addition of an input capacitor C8 at the negative input of comparator 552, and the connection of an additional feedback resistor R9 at the negative input of comparator 552.

As in the previous embodiment, AC gain in circuit 550 is set by means of feedback voltage divider R8/R7, which allows a much smaller feedback rectangular wave than the usual full-supply-voltage "high" and "low" size (e.g. from +5 V to GND). In this case, the DTSOA is operated as a delta-modulator, with C8 as its input capacitor. The rectangular wave is coupled through capacitor C6 to the DTSOA's delta-modulator feedback resistor R9. The FET-buffered transducer output voltage (with R4 as load) is fed to the DTSOA's delta-modulator input capacitor C8.

Figure 20:
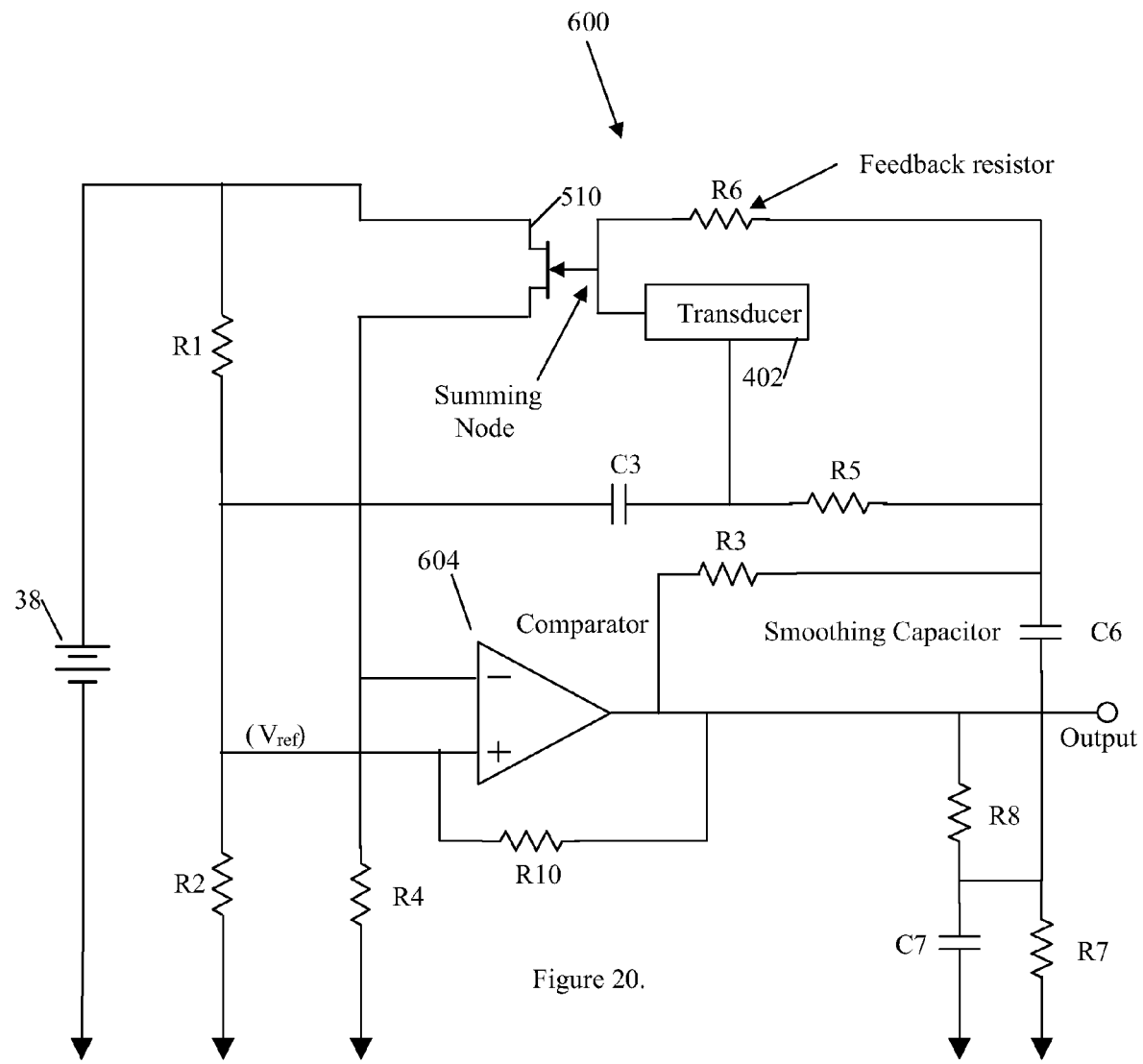
FIG. 20 is a schematic diagram of a modified version of the embodiment shown in FIG. 18, wherein the time reference is generated by the circuit itself, instead of being received from an external source.

In the embodiment of FIG. 20, the circuit 600 is very similar to circuit 500 of FIG. 18, and like reference numbers have been used for like components as appropriate. However, unlike circuit 500, there is no digital logic processing module at the output of comparator 604 in the circuit of FIG. 20. Therefore, since this circuit lacks an input for an external time reference, positive feedback is added via R10 between the output of comparator 604 and the positive input, to create hysteresis that induces the circuit to oscillate, thus providing its own time reference. In addition, though the AC and DC feedback circuits are still separate, they are, in this case, driven by a single digital output, i.e. that of comparator 604, rather than by separate outputs from the comparator and from the digital logic processing module as in FIG. 18. Thus, the digital output of circuit 600 contains both the DC offset signal and the high-gain delta-modulated (AC) transducer signal. This is not a major inconvenience, however, as further digital processing (e.g. within a host microcontroller) can remove the DC offset signal.

In the circuit of FIG. 20, the DTSOA from the embodiment of FIG. 12 is opened up and expanded to include the FET 510, and the entire circuit is operated as a delta-modulator. Next, the "D" latch 406 of FIG. 18 is removed, and the comparator output is thus used both for AC and DC feedback. AC gain is set by means of feedback voltage divider R8/R7, which allows a much smaller feedback rectangular wave than the usual full-supply-voltage "high" and "low" size (e.g. from +5 V to GND). The rectangular wave is coupled through capacitor C6 to the transconductance feedback resistor R6.

The DC component of the digital output from circuit 600 is a quiescent duty cycle (whatever duty cycle is necessary to create the DC voltage to satisfy the DC feedback loop). The AC component is a delta-modulated deviation from the "DC component" of the duty cycle. In order still to have a time reference after removal of the Tref-driven "D" latch 406, positive feedback through voltage divider R10/(R1 II R2) promotes predictable circuit oscillation. Therefore, rather than having an external time reference as in the circuits of FIGS. 17 to 19, circuit 600 generates an intrinsic time reference.

Figure 21:
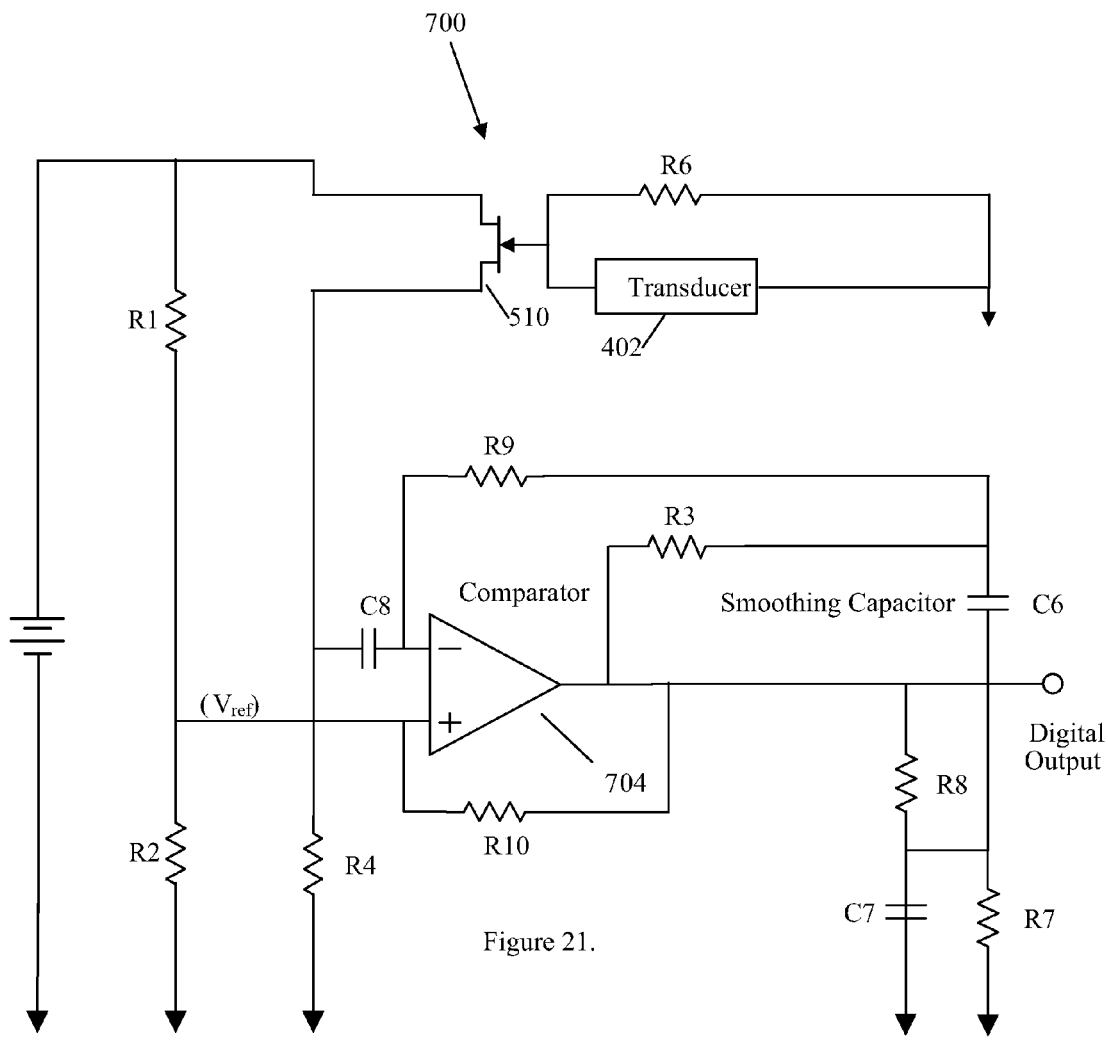
FIG. 21 is a schematic diagram of a modified version of the embodiment shown in FIG. 20 in which a voltage-mode circuit is substituted for the transconductance circuit.

FIG. 21 illustrates a circuit 700 according to another embodiment, wherein the amplifier is configured as a DTSOA-based "delta modulator" with an intrinsic time reference, as in FIG. 20, to which is input the signal from a "voltage output mode" piezoelectric transducer circuit, similar to the arrangement in FIG. 19. This circuit provides AC-DC feedback separation in operation with a conventional "voltage output mode" piezoelectric transducer. Such transducers may be fitted with either an amplifier, or, more commonly, with an FET 510, as an output voltage buffer device. Circuit 700 retains most aspects of the circuit 600, except that the piezoelectric transducer is operated in its "voltage output mode", and an input capacitor C8 is added at the input of comparator 704, in order to complete a self-oscillating DTSOA-based delta-modulator. As in FIG. 20, positive feedback is provided via feedback resistor R10. An additional feedback resistor R9 is connected to the negative input of comparator 704. As with the circuit 600, this circuit's digital output contains both the DC offset signal and the high-gain delta-modulated (AC) transducer signal. This very simple embodiment of the AC-DC feedback separation method is quite useful in piezoelectric transducer applications where the advantages of transconductance operation are not required, and where an ultra-low-cost "voltage output mode" transducer may be available. The circuit of FIG. 21 provides a low-cost delta-modulator that operates directly from a piezoelectric transducer output and provides a convenient digital signal without requiring the intervening amplification used in prior art.

As in FIG. 20, the comparator output in the circuit of FIG. 21 is used to create a DC output signal (for DC offset control by means of feedback). The comparator output is used both for AC and DC feedback. AC gain is set by means of feedback voltage divider R8/R7, which allows a much smaller feedback rectangular wave than the usual full-supply-voltage "high" and "low" size (e.g. from +5 V to GND). The DTSOA is operated as a delta-modulator, with C8 as its input capacitor. The rectangular wave is coupled through capacitor C6 to the DTSOA's delta-modulator feedback resistor R9. The FET-buffered transducer output voltage (with R4 as load) is fed to the DTSOA's delta-modulator input capacitor C8.

In this circuit, as in FIG. 20, the single digital output signal naturally comprises both AC and DC signals. The DC component is a quiescent duty cycle (whatever duty cycle is necessary to create the DC voltage to satisfy the DC feedback loop). The AC component is a delta-modulated deviation from the "DC component" of the duty cycle. In order to have a time reference after removal of the Tref—driven "D" latch, positive feedback through voltage divider R10/(R1 II R2) promotes predictable circuit oscillation.

Figure 22:
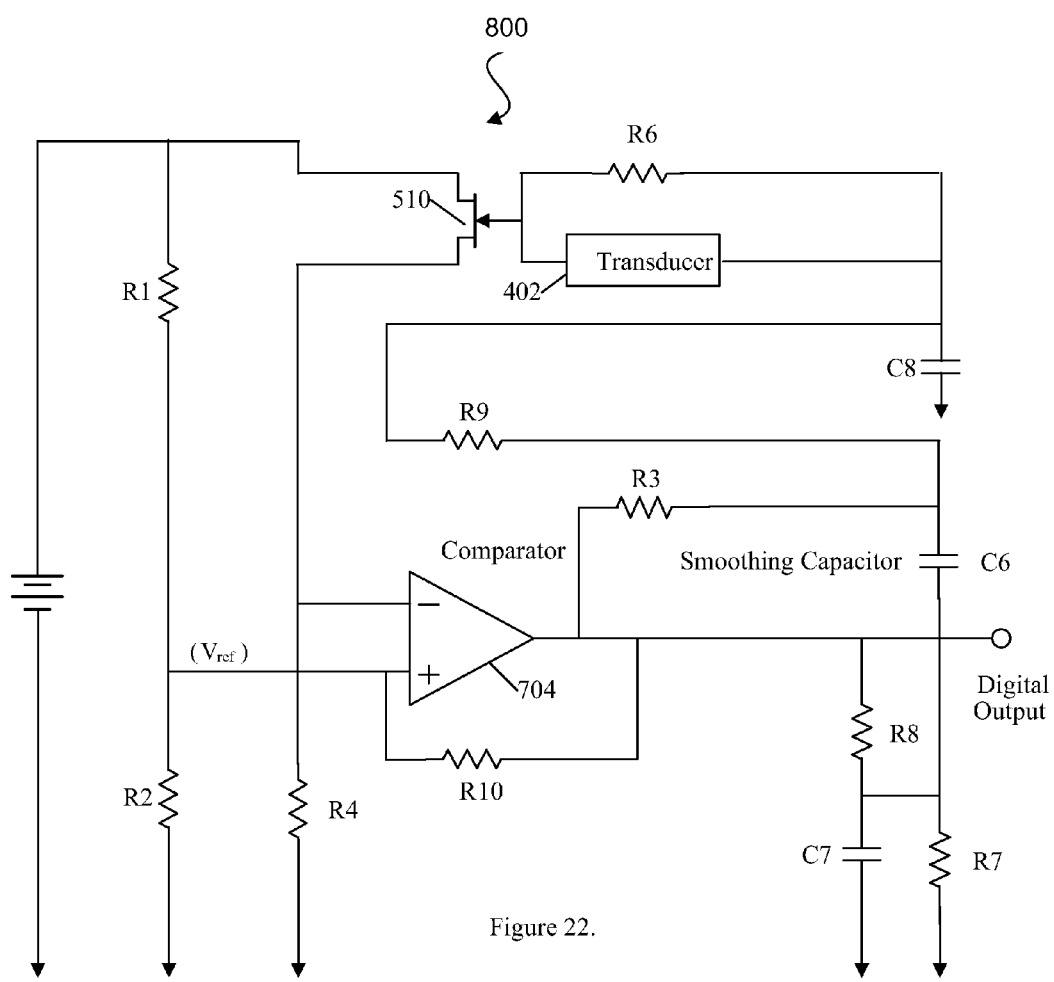
FIG. 22 is a schematic diagram of a modified version of the voltage-mode circuit of FIG. 21.

FIG. 22 illustrates a circuit 800 according to another embodiment, which is a modification of the voltage output mode circuit of FIG. 21 in which the transducer 402 and its buffer FET 510 are included in the feedback loop for control. Some components of FIG. 22 are identical to those of the previous embodiment, and like reference numerals have been used for like components as appropriate. The circuit of FIG. 22 functions identically to the circuit 700 of FIG. 21, except that the delta-modulator circuit is modified to include the transducer 402 and FET 510.

As illustrated in FIG. 22, resistor R9 is connected in a feedback loop through transducer 402 and FET 510, rather than directly to the negative input of comparator 704 as in FIG. 21. Though the circuit 800, at first glance, does not resemble a delta-modulator, it yet can be seen, with the understanding that the buffered transducer output impedance is much lower than R9, that the comparator input still receives the sum of the transducer voltage and capacitor C8 voltage and that the comparator still controls the voltage on C8 by feedback via R9, thus preserving the delta-modulator function.

In the circuit 800 of FIG. 22, the node "transducer/R6/C8/R9" functions as a comparator input of very high impedance (that of the FET gate), which allows, in practical designs, the use of higher impedance values for C8 and R9.

FIGS. 17 to 22 illustrate several embodiments of circuits in which separate AC/DC feedback paths are provided in transducer DTSOA circuits. In each circuit, the AC feedback is adjustable somewhat independently by R8 and R7, and the DC feedback is adjustable somewhat independently by R3. C7 is incidental to signal processing, being present merely to limit high-frequency feedback gain and associated instability. Smoothing capacitor C6 performs the additional function of coupling the delta-modulating square wave (sized by the R8/R7 voltage divider) to a feedback resistor (R6 for transconductance operation as in FIGS. 17, 18, and 20; R9 for voltage-mode operation as in FIGS. 19 and 21). These five circuits are non-limiting in scope. The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims, in which reference to an element in the singular is not intended to mean "one and only one" unless explicitly so stated, but rather "one or more". Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. '112, sixth paragraph, unless the element is expressly recited using the phrase "means for" or, in the case of a method claim, the element is recited as a "step" instead of an "act". Absent express definitions herein, claim terms are to be given all ordinary and accustomed meanings that are not irreconcilable with the present specification and file history.

What is claimed is:

1. A discrete time sampled operational amplifier (DTSOA)-based transconductance circuit, comprising: at least one input line; a piezoelectric transducer in the input line; an amplifier circuit receiving signals on the input line and generating at least two outputs; and at least two feedback elements through which at least two outputs are sent back to the input line.

2. The DTSOA circuit of claim 1, wherein the amplifier circuit includes at least one comparator connected to the input line and having at least one output, and at least one digital logic processing circuit having an input connected to the comparator output and generating at least one signal output, the signal output of the digital logic processing circuit representing the signal on the input line.

3. The DTSOA circuit of claim 1, wherein the amplifier and logic processing circuit functions are established at least in part by a microcontroller.

4. The DTSOA circuit of claim 1, wherein at least one feedback element is a resistor.

5. The DTSOA circuit of claim 1, wherein at least one feedback element is a charge-switching circuit.

6. The DTSOA circuit of claim 1, wherein the feedback elements comprise at least one resistor and one capacitor.

7. The DTSOA circuit of claim 1, wherein the amplifier circuit includes at least one FET having its gate connected to the input line, a comparator having an input connected to the FET and an output, at least one digital logic processing circuit connected to the comparator output and generating at least one signal output, the signal output representing the signal on the input line.

8. The DTSOA circuit of claim 7, wherein the amplifier and logic processing circuit functions are established at least in part by a microcontroller.

9. The DTSOA circuit of claim 7, wherein at least one feedback element is a resistor.

10. The DTSOA circuit of claim 7, wherein at least one feedback element is a charge-switching circuit.

11. The DTSOA circuit of claim 7, wherein the feedback elements comprise at least one resistor and one capacitor.

12. A discrete time sampled operational amplifier (DTSOA)-based circuit, comprising: at least one input line; a piezoelectric transducer in the input line; an amplifier circuit receiving signals on the input line and generating an output; and at least two feedback elements through which the output is sent back to the input line.

13. The DTSOA circuit of claim 12, wherein the amplifier circuit comprises at least one field effect transistor (FET) having its gate connected to the input line, and at least one comparator configured to receive at least one signal from the FET and to generate at least one output representing the signal on the input line.

14. The DTSOA circuit of claim 12, wherein at least one feedback element is a resistor.

15. The DTSOA circuit of claim 12, wherein at least one feedback element is a charge-switching circuit.

16. The DTSOA circuit of claim 12, wherein the feedback elements comprise at least one resistor and one capacitor.

17. A piezoelectric transducer signal processing circuit, comprising: at least one input line; a "voltage output mode" piezoelectric transducer circuit in the input line; and a discrete time sampled operational amplifier (DTSOA)-based differentiator ("delta-modulator") circuit receiving signals on the input line and generating an output.

18. The circuit of claim 17, comprising at least one feedback element through which the output is sent back to the input line.

19. The circuit of claim 18, wherein the feedback element is a resistor.

20. The circuit of claim 17, further comprising at least two feedback elements through which the output is sent back to the input line.

21. The circuit of claim 20, wherein the feedback elements comprise at least one resistor and one capacitor.

22. The circuit of claim 18, wherein the DTSOA circuit includes a comparator having an input connected to the input line, a buffer field effect transistor (FET) is connected to the transducer, and the feedback element, transducer, and FET are included in a feedback loop connected to the comparator input.

* * * * *